United States Patent
Reohr et al.

(12) 
(10) Patent No.: US 6,335,890 B1
(45) Date of Patent: Jan. 1, 2002

(54) SEGMENTED WRITE LINE ARCHITECTURE FOR WRITING MAGNETIC RANDOM ACCESS MEMORIES

(75) Inventors: William Robert Reohr, Chappaqua, NY (US); Roy Edwin Scheuerlein, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/703,963

(22) Filed: Nov. 1, 2000

(51) Int. Cl.[7] ................................................. G11C 11/02
(52) U.S. Cl. .......................... 365/225.5; 365/55; 365/66
(58) Field of Search ................................. 365/225.5, 55, 365/66, 230.03, 171, 173

(56) References Cited

U.S. PATENT DOCUMENTS

| | | | | |
|---|---|---|---|---|
| 6,111,781 A | * | 8/2000 | Naji ............................... | 365/158 |
| 6,111,783 A | | 8/2000 | Tran et al. ...................... | 365/171 |
| 6,191,972 B1 | * | 2/2001 | Mirura et al. .................. | 365/171 |
| 6,215,707 B1 | * | 4/2001 | Moyer ............................ | 365/173 |
| 6,256,224 B1 | * | 7/2001 | Perner et al. .................. | 365/173 |

* cited by examiner

*Primary Examiner*—Tan T. Nguyen
(74) *Attorney, Agent, or Firm*—Marian Underweiser

(57) ABSTRACT

An architecture for selectively writing one or more magnetic memory cells in a magnetic random access memory (MRAM) device comprises at least one write line including a global write line conductor and a plurality of segmented write line conductors connected thereto, the global write line conductor being substantially isolated from the memory cells. The architecture further includes a plurality of segmented groups, each segmented group including a plurality of memory cells operatively coupled to a corresponding segmented write line conductor, and a plurality of segmented group select switches, each group select switch being operatively connected between a corresponding segmented write line conductor and a write line current return conductor, the group select switch including a group select input for receiving a group select signal, the group select switch substantially completing an electrical circuit between the corresponding segmented write line conductor and the write line current return conductor in response to the group select signal. A plurality of bit lines are operatively coupled to the magnetic memory cells for selectively writing the state of the memory cells.

20 Claims, 11 Drawing Sheets

SEGMENTED WRITE LINE ARCHITECTURE FOR WRITING MAGNETIC RANDOM ACCESS MEMORIES

STATEMENT OF GOVERNMENT RIGHTS

This invention was made at least in part with Government support under grant contract number MDA972-99-C-0009 awarded by the Defense Advanced Research Projects Agency (DARPA) of the U.S. Department of Defense. The Government has certain rights in the invention.

BACKGROUND OF THE INVENTION

1. Field of the Invention

The present invention relates generally to random access memory systems, and more particularly relates to an architecture for improving the write margin within magnetic random access memory (MRAM).

2. Description of the Prior Art

Thin film magnetic random access memory (MRAM) has been investigated since the early 1950s. However, as described in the text "Computer Storage Systems and Technology," by Richard E. Matick, John Wiley & Sons (1977), which is incorporated herein by reference, these memories were deemed to be impractical due to narrow write margins and read margins which eroded as device dimensions were scaled. By the early 1970s, semiconductor-based memories, such as dynamic random access memory (DRAM), promised a simpler more compact memory solution than magnetic core memories, the most prevalent random access memory (RAM) available at the time. By the late 1970s, almost all development and production activity related to MRAM had been abandoned.

Recently, a renewed interest in MRAM has been sparked by its application to the non-volatile memory market. New memory devices, such as the Magnetic Tunnel Junctione (MTJ) device, which exhibits magneto resistance, overcame the earlier obstacle of inductive sensing. As summarized in Scheuerlein et al., "A 10 ns Read and Write Non-Volatile Memory Array Using a Magnetic Tunnel Junction and FET Switch in Each Cell," ISSCC 2000, pp. 128–129, desirable characteristics of MTJ-based memories include high integration density, high speed, low read power, and Soft Error Rate (SER) immunity.

FIGS. 1A and 1B depict two alternative configurations found in traditional memory architectures. Like conventional thin film RAM, MTJ RAM uses an architecture in which memory cells 100 are placed at the cross-points of intersecting word and bit lines. In the MTJ MRAM design described by Scheuerlein et. al. (see FIG. 1A), reading of the memory cell has been simplified by the inclusion of a field effect transistor (FET) 102 within each cell for improved isolation. FIG. 1B depicts an alternative higher density MTJ MRAM architecture described by Frank Z. Wang in "Diode-Free Magnetic Random Access Memory Using Spin-Dependent Tunneling Effect," *Applied Physics Letters*, Vol. 77, No. 13, pp. 2036–2038 (Sep. 25, 2000). In conventional magnetic memory architectures, however, writing individual memory cells without also writing adjacent or other non-intended cells remains a most vexing problem.

Typically, writing a memory cell involves passing electrical currents simultaneously through a bit line and word line, at the intersection of which an intended MTJ cell resides. The selected MTJ cell will experience a magnetic field which is the vector sum of the magnetic fields created by the word and bit line currents. All other MTJ devices that share the same bit line or word line as the selected MTJ device will be half-selected and will thus be subjected to either bit line or word line magnetic fields, respectively. Since the magnitude of the vector sum of the word line and bit line fields is about forty-one percent (41%) larger than the individual word line or bit line fields, the selectivity of a selected MTJ cell over half-selected MTJ cells is poor, especially when the non-uniform switching characteristics of the MTJ cells are considered.

Variations in the shape or size of an MTJ cell can give rise to variations in magnetic thresholds of the MTJ cells which are so large that it is virtually impossible to write a selected cell without also switching some of the half-selected cells, thus placing the reliability and validity of the stored data in question. There may also be environmental or other factors, such as temperature and processing variations, that adversely impact the write select margin. Additionally, creep, which generally refers to the spontaneous switching of a MTJ cell when it is subjected to repeated magnetic field excursions much smaller than its nominal switching field, narrows the acceptable write select margin even further thereby making the need for greater selectivity of individual MTJ cells even more imperative.

FIG. 2A depicts the magnetic selectivity of an ideal thin film magnetic memory element as described by Stoner-Wohlfarth. Assuming that the word line and bit line currents generate fields along the hard magnetic axis 210 and easy magnetic axis 230, respectively, of the magnetic element, the field ($H_x$, $H_y$) required to switch the magnetic state of the element must equal or exceed the solid curve or boundary 200. This curve 200, known by those skilled in the art as the switching asteroid, satisfies the relation $H_h^{2/3} + H_e^{2/3} = H_k^{2/3}$, where $H_h$ is the hard axis field, $H_e$ is the easy axis field and $H_k$ is the anisotropy field. A selected cell experiences magnetic fields outside the boundary of the switching asteroid 200 (e.g., corresponding to point 220) which are large enough to write the magnetic element to a state that aligns with the easy axis field direction. The state of a half-selected cell doesn't change since the magnetic fields acting on it (e.g., corresponding to points 210 and 230) remain within the boundary of the switching asteroid 200.

It is important to consider that, although depicted as a thin fixed boundary line, the switching asteroid 200, in reality, may significantly change shape due to environmental conditions (e.g., temperature) or other factors (e.g., processing variations). Variations between individual MTJ cells substantially reduce the write select margin within the overall memory structure. Nonideal physical artifacts blur the distinction between half-selected and selected cells; the former could be written in a write operation intended only for the latter.

Hence a major hurdle to the realization of practical sub-micron MRAM architectures has been the problem of write selectivity. There is a need, therefore, in the field of magnetic memory devices and systems for an improved write selection mechanism which can be adapted readily to the present MRAM architecture as well as other alternative architectures.

SUMMARY OF THE INVENTION

It is an object of the present invention to provide a write architecture for use in a magnetic random access memory (MRAM) system that allows selection of individual MTJ cells in an array without adversely disturbing neighboring cells in the array and thus increasing the integrity of the data stored in the memory array.

It is another object of the present invention to provide an improved write selection architecture and methodology for MRM that is compatible with conventional MRAM systems.

It is yet another object of the present invention to provide a write selection architecture for MRAM that utilizes a substantially reduced bit line current, resulting in lower overall system power consumption.

It is a further object of the present invention to provide a write selection architecture for MRAM that has a substantially increased acceptable write disturb margin and is thus less sensitive to MTJ device mismatches, process variations and other environmental factors within an MRAM array.

The present invention revolutionizes the field of magnetic memory devices by providing an improved write selection architecture and methodology for use with magnetic random access memory (MRAM) that not only allows selection of individual MTJ cells in an array without adversely disturbing neighboring cells in the array, but also reduces the power consumed in the write operation and the overall sensitivity of the circuit to device mismatches, process variations and other environmental factors.

In accordance with one embodiment of the present invention, an improved architecture for selectively writing one or more magnetic memory cells in a magnetic random access memory (MRAM) device comprises one or more global write lines and a plurality of segmented write lines connected thereto. The global write lines are substantially isolated from the magnetic memory cells. A plurality of segmented groups, each segmented group including a plurality of magnetic memory cells, are operatively coupled to each segmented write line. The architecture of the present invention further includes at least one write line current return conductor or path for returning the write current supplied to a selected segmented group of memory cells. At least one segmented group select switch is preferably connected between the write line current return conductor and the segmented write line corresponding to the segmented group, the group select switch including a group select input for receiving a group select signal. The group select switch substantially completes an electrical circuit between the segmented write line and the write line current return conductor in response to the group select signal. Bit lines operatively coupled to the magnetic memory cells are used to write the state of a selected segmented group of memory cells.

In accordance with another embodiment of the present invention, the write line current return conductor is modified to form a write line current return network. The current return network includes a plurality of switches operatively connected between a selected segmented write line conductor and one or more unselected segmented write line conductors. The switches are responsive to at least one select signal, each select signal corresponding to a segmented bit slice, for distributing the return write line current across one or more unselected segmented groups in a predetermined manner.

These and other objects, features and advantages of the present invention will become apparent from the following detailed description of illustrative embodiments thereof, which is to be read in connection with the accompanying drawings, wherein like elements are designated by identical reference numerals throughout the several views.

DETAILED DESCRIPTION OF THE PREFERRED EMBODIMENTS

Figure 3:
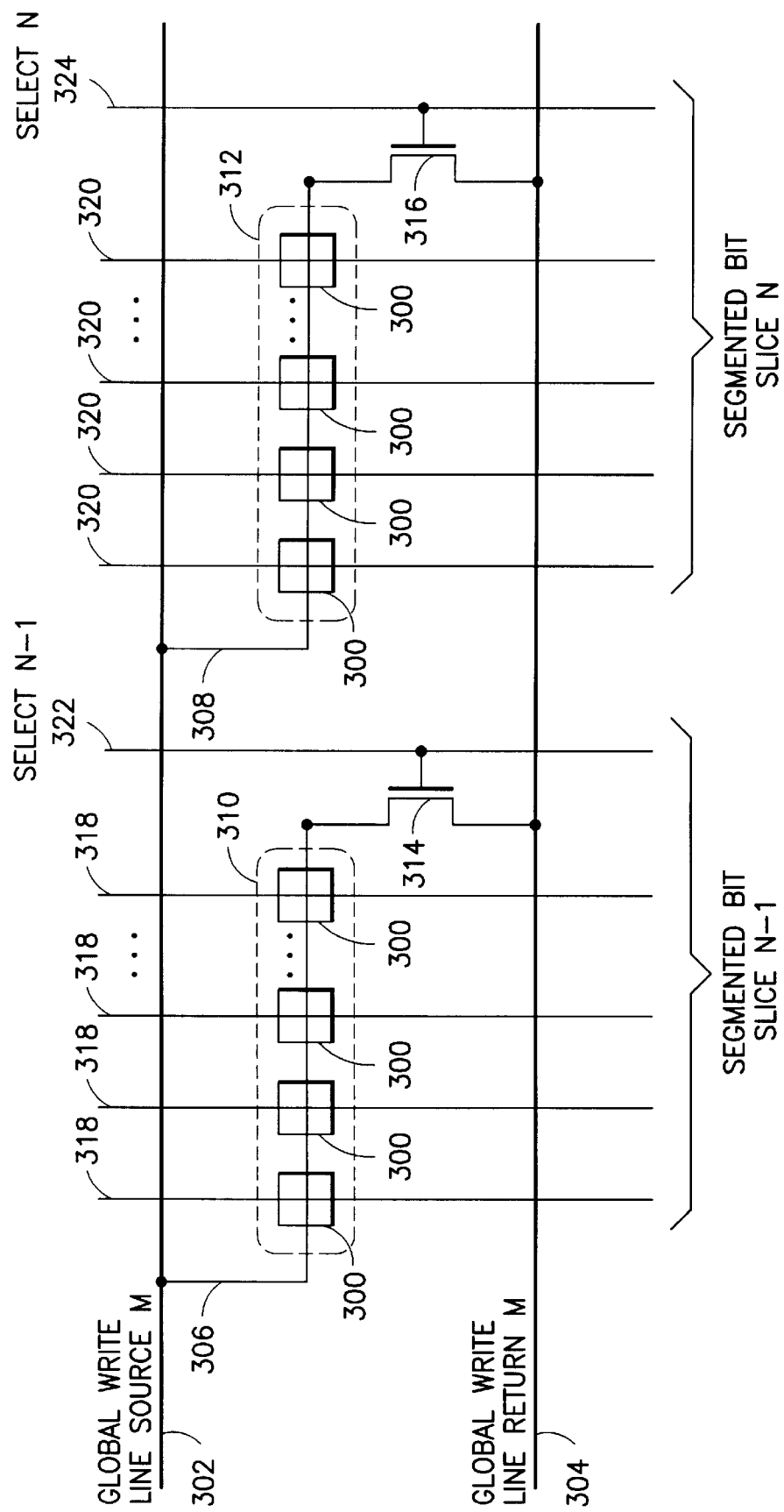
FIG. 3 is an electrical schematic diagram illustrating a segmented write line architecture formed in accordance with the present invention.

FIG. 3 generally illustrates a segmented write line architecture for providing improved MRAM write selectivity formed in accordance with the present invention. This architecture, among other features, achieves a reasonable cell density combined with a high degree of write isolation. The present invention will be described herein with reference to magnetic tunnel junction (MTJ) memory devices, although it should be appreciated that other suitable magnetic devices may be similarly employed with and are contemplated by the present invention.

Referring now to FIG. 3, a write line is preferably formed including a global or shared portion 302 which functions essentially as a bus, and a plurality of segment portions 306, 308 connected thereto. In FIG. 3, only two global write lines 302, 304 are depicted, although any number of global write lines may be included, depending upon the size and organization of the memory array, as appreciated by those skilled in the art. It is important that the segmented write line portions 306, 308 be physically separated from the global write line portion 302 by a predetermined distance but yet be in close proximity (or even connected) to the memory cells to which a particular segmented write line corresponds so as to reduce the adverse effects of stray magnetic field interaction between selected and non-selected groups of memory cells. Unlike conventional array architectures, write current traverses through the memory cell region via the global write lines (either along the bit or word line dimension) without coupling a significant hard axis magnetic field to the memory cells. Instead, write current flows from the global write line through a selected segmented write line where it provides a significant hard axis field to a subset of memory cells.

As shown in FIG. 3, a group or subset 310 comprising one or more memory cells 300 is coupled to a segmented write line portion 306. The group 310 of memory cells 300 associated with any one segmented write line 306 may be referred to herein as a segmented group. During a write operation, all memory cells 300 within a segmented group 310 (i.e., cells coupled to a segmented write line) are destabilized simultaneously by driving a current from one global write line 302, and steering this current through one of the segmented write lines 306 connected to the global write line 302. It should be appreciated that each memory cell 300 in a segmented group 310, 312 may either be directly connected to a segmented write line 306, 308 (e.g., via an electrical conductor) or indirectly connected, such as by magnetic coupling. In either case, the memory cells within each segmented group must be in close enough proximity to the corresponding segmented write line such that a strong magnetic field originating from the segmented write line can be coupled into the memory cells in order to destabilize only those cells within the intended segmented group and not memory cells associated with adjacent segmented write lines or global write lines.

As known by those skilled in the art, the magnetic field strength of a wire conductor decays as the inverse of the radial distance outward from the conductor. Magnetic isolation is therefore achieved by adequately spacing one group of memory cells from the conductor(s) used to write another group of memory cells. Of course this spacing will primarily depend upon the characteristics of the magnetic memory device itself, defined, at least in part, by the switching asteroid for the particular device, as previously discussed above.

Another significant aspect of isolation concerns the direction of the applied fields, namely, whether fields are primarily in-plane or out-of-plane. Bit lines and segmented write lines will emanate radial magnetic fields which are primarily directed within the plane of the memory elements. Global write lines, on the other hand, may generate out-of-plane radial magnetic fields. In-plane fields switch magnetic elements according to the manner prescribed previously with respect to the switching curves in FIGS. 2A and 2B. In this case, the total anisotropic switching field, $H_k$, need only be around 100 Orstead, whereas a field strength in excess of a 1 Tesla is required to point the magnetic domains of the memory elements out-of-plain (due to significantly larger and more local demagnitization field). Isolation may then be assessed by considering the relative proximity of write line conductors to memory elements and the orientation (i.e., in-plane vs. out-of-plane) of the field.

Figure 2B:
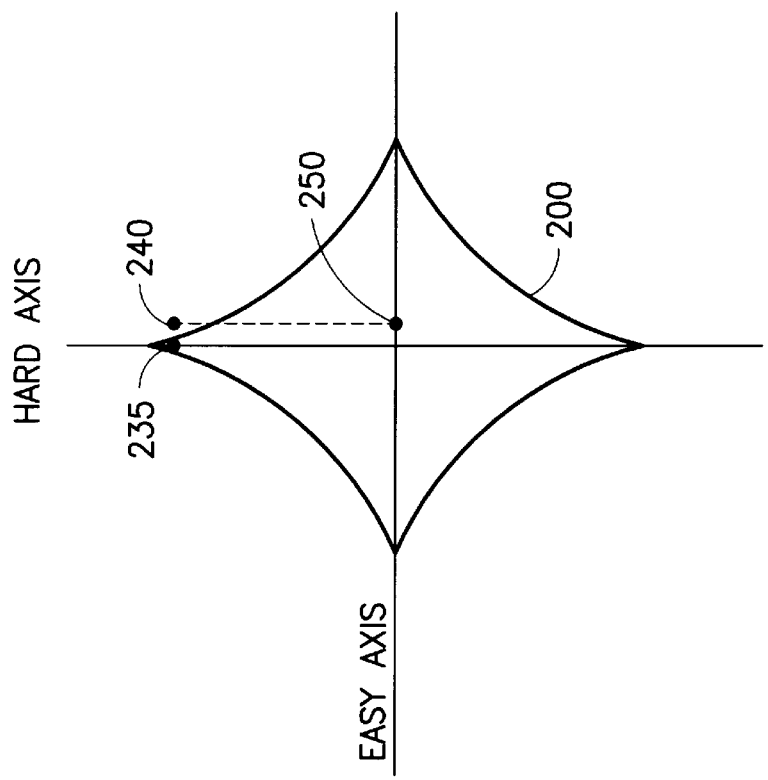
FIG. 2B is a graphical representation of magnetic field points superimposed on a switching asteroid illustrating a write operation for a segmented write line architecture formed in accordance with one embodiment of the present invention.
Figure 2A:
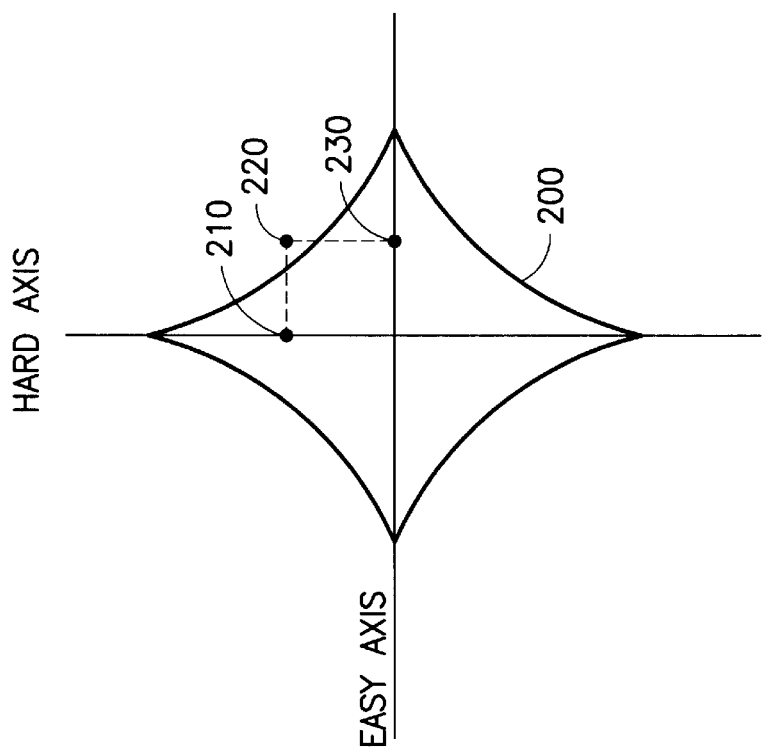
FIG. 2A is a graphical representation of magnetic field points superimposed on a switching asteroid illustrating a write operation for a conventional magnetic memory architecture.

With continued reference to FIG. 3, during each write cycle, write current preferably passes through a segmented write line conductor 306 of each memory cell 300 within a selected segmented group 310, thus establishing a magnetic field along the hard axis of each magnetic device within the segmented group 310. The magnetic field is preferably substantially localized to those individual segmented group cells as depicted on the switching asteroid of FIG. 2B. The field created by the write line current preferably destabilizes the magnetic moment of each memory cell 300 in the segmented group 310, 312. Each destabilized memory element is subsequently written to a "1" or "0" logic state by driving a positive or negative current, respectively, through the corresponding bit line conductors 318, 320 coupled to the memory cells. The bit line current creates a small positive or negative electromagnetic field along the easy axis of each memory cell and thus drives each cell to its final "1" or "0" state. As shown in FIG. 2B, such a selected memory cell has a field point 240 outside the switching asteroid boundary 200 while a half-selected cell, having a common bit line with the selected cell, has a field point 250 far within the boundary 200 of the switching asteroid (due to the reduced magnitude of the bit line field).

In comparison to conventional write architectures, the write margin (i.e., the difference between selected and unselected cells) of the segmented write line approach of the present invention is dramatically improved by restricting the application of the hard axis field to selected cells only. Half-selected cells do not exist in the word dimension (i.e., hard axis) of FIG. 2B. The conventional write architecture illustrated in FIG. 2A, however, has half-selected field points 230 and 210 along both bit lines and word lines, respectively, which substantially reduces the write margin.

With continued reference to FIG. 3, as discussed above, the segmented write line conductor 306 passing through each cell 300 is preferably proximate to, but may be electrically isolated from, the magnetic memory element forming the cell. Bit lines 318, 320 are preferably substantially orthogonal (perpendicular) to the segmented write lines 306, 308 respectively.

Destabalizing current is supplied by one global write line (e.g., 302) and is preferably returned via a write line current return conductor, such as another global write line (e.g., 304), through a group select switch 314, 316 or equivalent device. Preferably, only one segmented write line group select switch is activated at a time, thus assuring that the full write line current flows through only one of the segmented group of memory cells 310, 312, respectively, at any given time. In this fashion, when the group select switch is not enabled (i.e., is off), current from a global write line will not flow through the segmented group associated with that particular group select switch. Consequently, the memory cells outside the selected segmented group will not be exposed to a destabilizing magnetic field (hard axis field).

The group select switch 314, 316 may be implemented, for example, as a single transistor or pass gate (as shown), although other suitable devices or more elaborate circuit configurations may be employed and are contemplated by the present invention. The group select switch 314, 316 preferably operates similarly to a conventional single-pole-single-throw (SPST) switch having a control input 322, 324 for selecting either one of a high resistance ("OFF") state and a low resistance ("ON") state. Once a particular segmented group 310 is selected, preferably by enabling the group select switch 314 associated therewith, current supplied by a global write line 302 passes through the segmented write line 306 corresponding to the selected segmented group 310, through the group select switch 314 and is returned along a write line current return conductor, preferably a different global write line 304. The group select switch 314 may also be connected to ground, rather than to another global write line.

By writing all memory cells in a segmented group simultaneously, the write line current, which establishes the select field along the hard axis, can be increased without concern that adjacent cells connected to the same global write line will become selected, as in the case of conventional MRAM architectures. Increasing the write line current is advantageous because the bit line current can then be significantly reduced for each cell to be written. As illustrated on the switching asteroid 200 in FIG. 2A, in conventional magnetic memory architectures, the magnetic memory device is operated with a substantially lower hard axis field 210 (in comparison to the present invention) in order to avoid disturbing memory devices connected to the common word line. This requires a substantially greater easy axis field 230 (thus a higher bit line current) in order to exceed the boundary 220 of the switching asteroid 200 and thereby define (i.e., write) the magnetic state of the device. By contrast, as shown on the switching asteroid 200 in FIG. 2B, with the unique segmented write line architecture of the present invention, the write line current is preferably increased (in comparison to conventional MRAM), thus the magnetic device is operated at a higher position 235 along the hard axis. It follows, therefore, that a substantially reduced easy axis field 250 (thus a reduced bit line current) is required in order to exceed the critical threshold, as represented by field point 240, defined by the boundary of the switching asteroid 200 and write the magnetic state of the device.

Matick, in his text (referenced above), summarizes a known problem and an improvement for writing conventional magnetic thin film memories (see e.g., pg. 302, "Computer Storage Systems and Technology") by stating that "[t]he memory organisation is influenced by another disturb problem, namely, that created by the word pulse on the selected line . . . . Even though no easy axis field is applied to these films in segment 2, the hard axis field must be large and typically can be larger than the disturb thresholds for this condition. Whenever writing is performed, therefore, either the entire physical word must be written or regeneration must be performed after writing." In contrast to MRAM architectures taught by the prior art, the term "segment," as used by Matick, refers to the group of memory cells connected to a word line which are simultaneously read or written within a memory cycle. In Matick, the extra infrastructure requirements for a segment relate only to the number of sense amplifiers and write circuits devoted to each segment. Matick does not describe any enhancement to or modification of the write line conductor, as defined by the present invention. Because the present invention provides a segmented write line structure, all memory cells along a word line are not written simultaneously.

Aside from significant differences in physical structure (e.g., having a write line including a global portion and a plurality of segmented portions connected thereto) as compared to that of conventional MRAM architectures, the "segment" as defined by the present invention preferably includes a corresponding switch or similar configuration to direct write current from a global write line through to a local or segmented write line in such a way as to allow a relatively large hard axis field to be applied across memory cells in a predetermined segment only, while subjecting memory cells in other unselected segments, all of which share the same global write line, to an insignificant hard axis field. By requiring that only those memory cells in a segmented group be written simultaneously, instead of an entire word line of memory cells as prescribed by conventional approaches, the present invention overcomes at least one significant problem of the prior art write method/structure, namely, the requirement of an excessive number of write circuits which, when activated simultaneously, consume significant power. The present invention thus insures that unselected memory cells sharing a global write line with a selected segmented group of memory cells receive only an inconsequential hard axis field and hence are essentially immune to word line disturbs.

Preferably, in the present invention the segmented group is small in size, such as sixteen (16) or thirty two (32) cells/bits for example, so as to reduce the magnitude of the total bit line current required. This configuration furthermore serves to bound the total number of independent bit line write drivers that are required. To achieve a simultaneous write of all the memory cells within a segmented group, each cell requires a dedicated bit line write driver to source or sink the current which is used to write the cell to a new binary state. For the case of extremely small segmented groups, such as those having only two or four cells/bits, a segmented group select switch may consume a greater die area than is desirable in relation to a memory cell. Hence, while such configuration is certainly within the scope of the present invention, it is not preferable. For instance, an NFET, functioning as the segmented group select switch in CMOS technology, should be suitably sized to transfer a relatively large destabilizing current from a segmented write line to a return conductor. With advances in processing technology, however, the size of a segmented group select switch may become insignificant in comparison to memory cell area. Therefore, while the present invention contemplates a segmented group of any size, a practical memory design preferably achieves a balance between segmented group select switch area and the number of independent write ports.

One skilled in the art will appreciate that segmented groups having large cell counts demonstrate reduced power consumption. It follows that since the write current is used to destabilize all memory cells in a segmented group, the power consumed as a result of the write current is amortized or shared across all the memory cells in the segmented group. Furthermore, the segmented write line architecture of the present invention uses only a relatively small bit line current, since only a small data (easy axis) field is needed to write a destabilized memory cell to a new binary state. By contrast, in a conventional MRAM architecture, only one memory cell is written at a time within a memory array. Each cell requires a destabilizing current and a bit line current of substantially equal magnitudes in order to provide reasonable write margins. Consequently, the novel architecture of the present invention not only achieves superior write selectivity, but it also consumes significantly less total write current.

Figure 4:
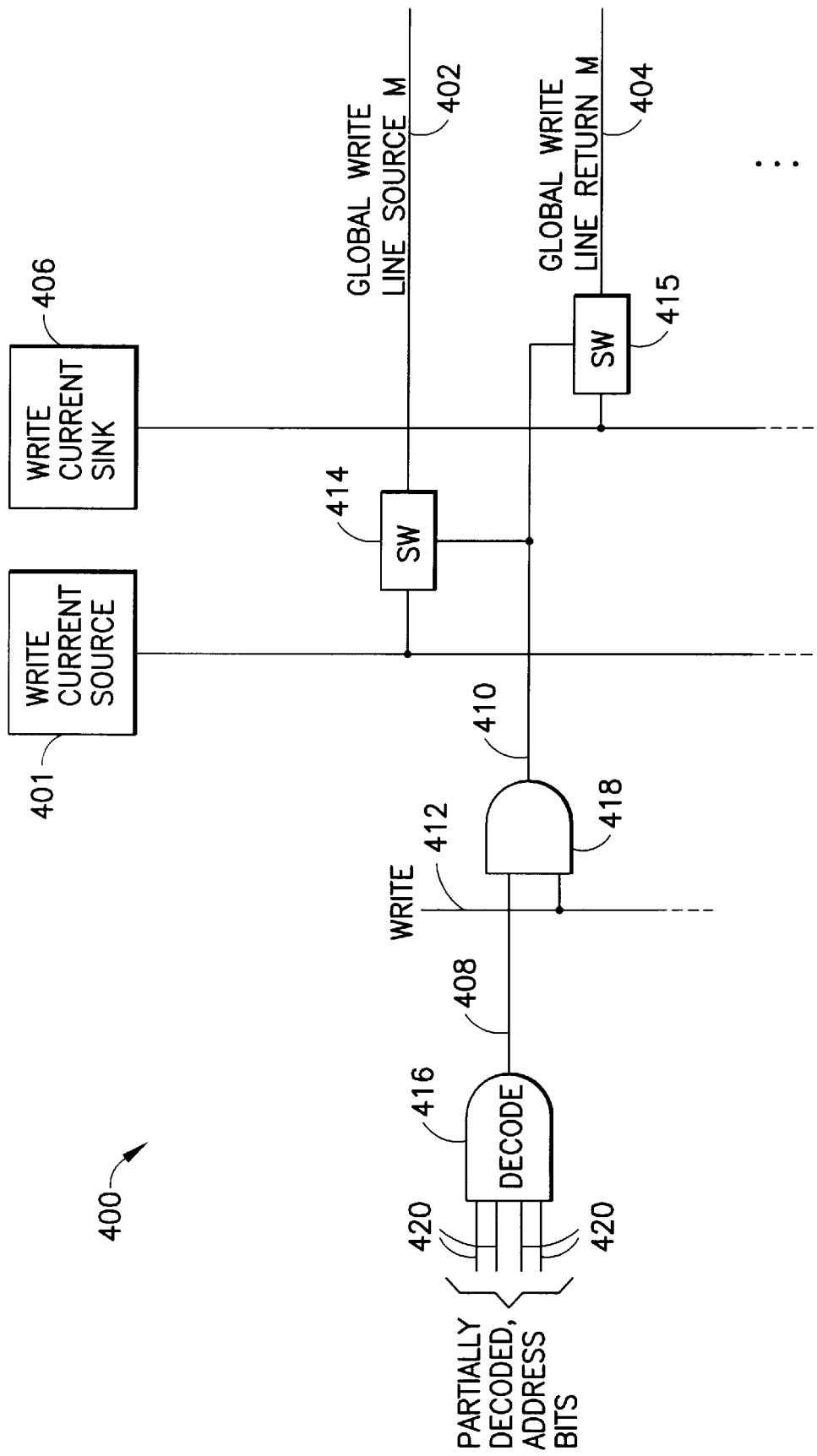
FIG. 4 is an electrical schematic diagram illustrating an exemplary decoder and driver circuit formed in accordance with the present invention for supplying and retrieving write current to and from, respectively, the segmented write line memory architecture of FIG. 3.

In FIG. 4 there is shown one embodiment of a write line current decoder/driver circuit 400 suitable for use with the segmented write line architecture of the present invention as illustrated in FIG. 3. The write line current driver 400 preferably functions to selectively direct current from a common write line current source 401 to a global write line 402, as well as to provide a write line current return path from, for example, another global write line 404, to a common write line current sink 406. Alternatively, the write line return current may returned to ground (rather than along a global write line), in which case current sink switch 415 may be omitted. It is to be appreciated that the write current source 401 and/or the write current sink 406 may reside either internal (i.e., on-chip) or external (i.e., off-chip) to the memory array. For purposes of simplification, the write line current driver circuitry is shown connected to two global write lines 402, 404. The present invention contemplates, however, that the write line decode circuitry described herein may be extended for application with any number of global write lines in a similar manner.

With continued reference to the driver circuit 400 of FIG. 4, a pair of switches 414, 415, or an equivalent thereof, are preferably used to electrically connect the global write lines 402, 404 respectively, to the write line current source 401 and sink 406. The switches 414, 415 are responsive to a write decode output signal 410 and are preferably enabled when a write signal 412 and address bits 420, corresponding to the particular memory cells to be written, are enabled. The address bits 420 are preferably at least partially decoded, for example by an AND logic gate 416, the output 408 of which may be logically ANDed 418 with the write signal 412. Other write decode schemes are contemplated and may be similarly employed with the present invention. As appreciated by those skilled in the art, each switch 414, 415 may be implemented by a single transistor pass gate. Alternatively, each switch may be realized, for example, as a pair of complimentary NMOS and PMOS transistors, a multiplexer, or the like, to provide a bi-directional write line current driver, whereby each global write line may be selectively connected to either a write line current source or current sink as desired. Furthermore, it should be appreciated that the switches 414, 415 are merely illustrative of the desired circuit function and that any suitable circuit configuration or means may be employed to selectively couple the global write lines 402, 404 of the segmented write line architecture to a write line current source/sink 401, 406.

Figure 5:
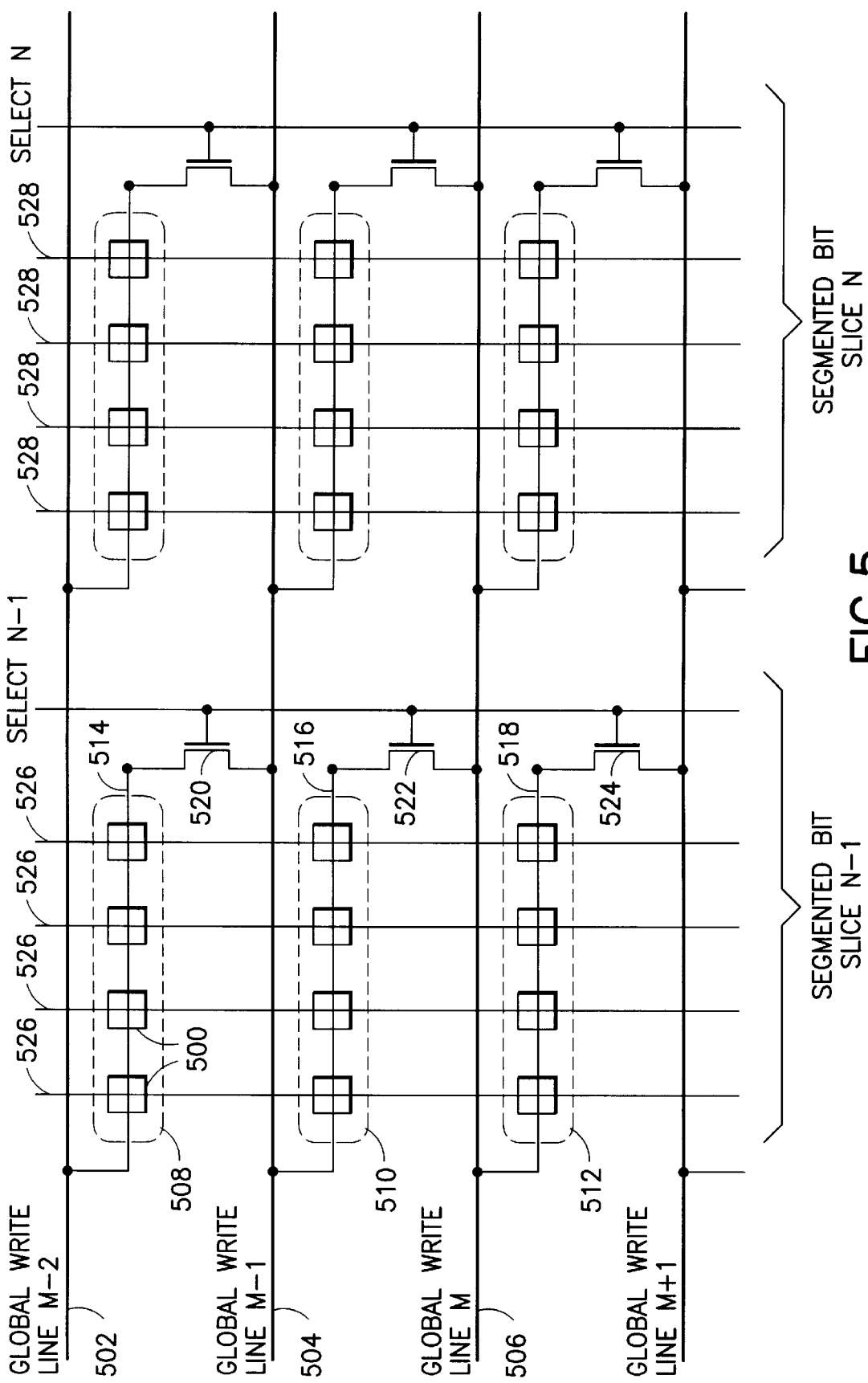
FIG. 5 is an electrical schematic diagram illustrating a shared global write line embodiment of the segmented write line memory architecture of the present invention.

FIG. 5 illustrates a preferred embodiment of the basic segmented write line architecture of the present invention, wherein a global write line may be used not only to source write line current to a segmented group of memory cells but also as a write line current return conductor for sinking write line current from a different segmented group, in essence reducing the number of global write lines by a factor of two. The principle and theory of operation of this shared global write line approach is essentially the same as for that described above in connection with the fundamental segmented write line architecture depicted in FIG. 3, with the added benefit of employing a global write line for both sourcing and sinking write line current, although not concurrently.

With reference now to FIG. 5, a global write line 506 may be coupled to a segmented group of memory cells 512 via a segmented write line 518 connected thereto for supplying a destabilizing write current to the segmented group 512. Additionally, the same global write line 506 may be connected to a group select switch 522 corresponding to an unselected or inactive segmented group of memory cells 510 within the same segmented bit slice (N−1), thereby functioning as the write current return path or conductor for the neighboring segmented group 510. The term "unselected" or "inactive," as used interchangeably herein, refers either to a segmented group of memory cells not intended for writing, or to a global write line (or segmented write line) that is not sourcing current to the memory cells (i.e., inactive) during a particular write cycle. Moreover, a segmented bit slice refers to the group of bit lines 526 coupled to memory cells associated with one or more segmented groups 508, 510, 512 in a vertical (column) dimension. It should be appreciated that the present invention similarly contemplates using this shared global write line approach among segmented groups that may not be adjacent to each other or reside within the same segmented bit slice. This would, however, require modification of the write decoding scheme.

Figure 6:
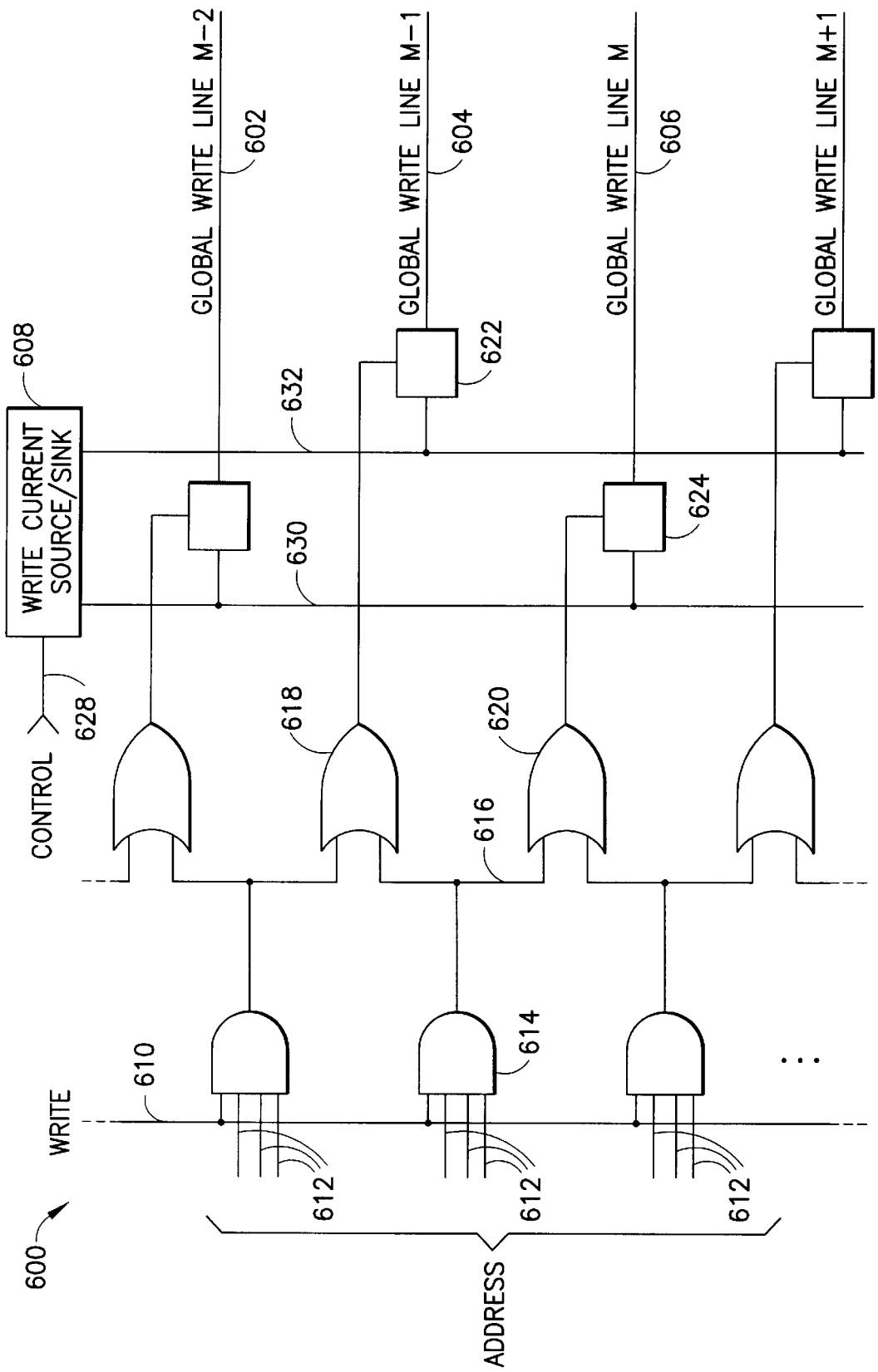
FIG. 6 is an electrical schematic diagram illustrating an exemplary decoder and driver circuit for supplying and retrieving write current to and from, respectively, the shared global write line embodiment of FIG. 5.

Although the present invention contemplates numerous write line current driver topologies suitable for use with the claimed segmented write line architecture, FIG. 6 illustrates an example of a preferred driver 600 for use with the shared global write line configuration of FIG. 5. As shown in FIG. 6, a write signal 610 is preferably logically ANDed 614 with a plurality of address bits 612 for selecting a desired group of memory cells to be written. The output 616 of a particular logical AND gate 614 is preferably connected to two logical OR gates 618, 620, thus when a desired segmented group is selected for writing, the two OR gates 618, 620 will operatively connect the appropriate global write lines 604, 606 to the write current source/sink 608 by enabling switches 622, 624, respectively. Preferably, the write current source/sink 608 includes at least one input 628 for selectively controlling which of its outputs 630, 632 is to be used as a current source or sink line. This control input 628 may be connected to one or more address bits, either directly or via additional decode circuitry.

Figure 7:
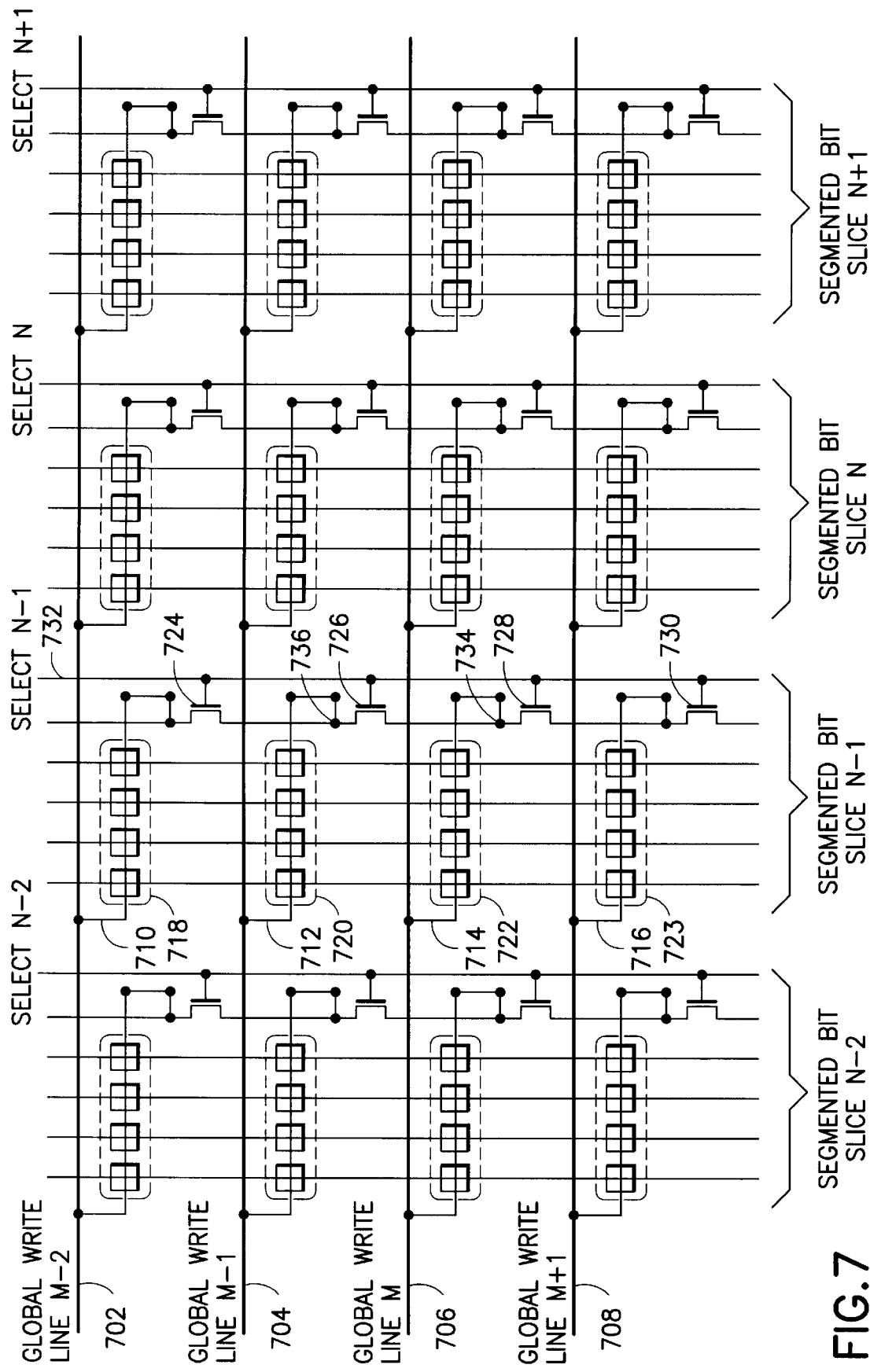
FIG. 7 is an electrical schematic diagram illustrating a segmented write line memory array featuring divided return current paths, formed in accordance with the present invention.

FIG. 7 illustrates another embodiment of a segmented write line architecture formed in accordance with the present invention. With this embodiment, an increased cell density may be realized. As depicted in FIG. 7, the write line current is preferably returned along two or more write line return current conductors or paths (e.g., global write lines) so that the return current is selectively distributed across, in essence, a network of multiple write line current return conductors in a predetermined manner. The distribution of the write line current across multiple return current paths provides a primary advantage of being able to significantly reduce or otherwise control the adverse effects of magnetic field interaction among adjacent memory cells. In order to accomplish this, the group select switch arrangement of the memory architecture shown in FIGS. 3 and 5 is preferably modified to provide multiple write current return paths, rather than a single return path. Unlike the embodiments of FIGS. 3 and 5, however, a partial hard axis field is applied to unselected segmented groups of memory cells. Even so, the write current flowing through any one write current return conductor will be divided and, consequently, the magnetic field emanating from the conductor will be significantly reduced.

As shown in the embodiment of FIG. 7, the distributed write line current return network comprises a plurality of switches that are operatively connected between a selected segmented write line and one or more unselected segmented write lines, either directly (as in the case of the first level of switches closest to the selected segmented write line) or indirectly via other switches preferably connected in a chained arrangement. The chaining of transistors allows the returned write current to subdivide, after every level of switches further removed from the selected segmented write line, along unselected segmented write lines. Memory cells may thus be placed closer to each other resulting in a denser memory configuration, as compared to the segmented write line architecture embodiments depicted in FIGS. 3 and 5.

Compact memory cells require the integration of a switch which is highly constrained along its vertical dimension. As described in the first and second embodiments of the present invention (FIGS. 3 and 5), the segmentation of the write line essentially eliminates the concern of disturbing half-selected memory cells along one of the write lines because all the cells in a selected segmented group coupled to a segmented write line are written simultaneously. While this is not entirely true for the embodiment of FIG. 7 (since adjacent cells may be subjected to a partial hard axis field), reduction of the half-select field along the hard axis of an unselected memory element is accomplished by the novel return current distribution scheme shown in FIG. 7.

With reference to the preferred embodiment of FIG. 7, which is described herein by way of example only, the segmented write line architecture is modified from the first embodiment (see FIG. 3) in that each segmented write line (e.g., 714) is preferably connected to two switches (which may be implemented as FETs) 726, 728 in a chain of switches, rather than a single switch. The switches 724, 726, 728, 730 corresponding to segmented groups 718, 720, 722, 723, respectively, within the same segmented bit slice (N−1) are preferably connected in a chain configuration and all switches in the chain are preferably controlled by a common select signal 732 in a similar manner to that previously described in connection with the embodiments of FIGS. 3 and 5. The two switches 726, 728 coupled to a segmented write line 714, however, provide multiple paths through which the write line current supplied by global write line 706 may be returned along adjacent segmented write lines 710, 712, 716 (and associated global write lines 702, 704, 708 respectively), rather than along a single global write line.

With continued reference to FIG. 7, memory cells in segmented group 722 are preferably selected to be written when a destabilizing current is driven into global write line 706 and the appropriate select signal 732 is activated (in this case, logic high). The destabilizing write current will preferably flow from global write line 706 through segmented write line 714, where the write line current then divides into two substantially equal portions at node 734, assuming that the impedance looking into the two diverging paths (connecting node 734 to NFETs 726 and 728, respectively) is relatively the same. Based on this assumption, half of the write line current will flow through NFET switch 726 while the other half of the write line current will flow through NFET switch 728. If the impedance looking into the two paths is different, the currents will split in proportion to the inverse of the impedance, as well known by those skilled in the art. At the next junction, namely node 736, the remaining write current portion splits again and can flow either through segmented write line 712 or through NFET switch 724. The fractional current in the adjacent segmented write line 712 preferably follows a return path first through the adjacent global write line 704, then through a switch (word/write line driver) and finally to a write current sink (see e.g., FIG. 8).

Likewise, the remaining fractional current at node 736 preferably passes through NFET switch 724 and further divides successively (in accordance with the impedance looking into each node) until the path back to the write line current sink (which may be ground) is eventually completed. The total write current sourced by the selected global write line flows across the selected segmented write line and then returns to the write current sink through multiple paths, all of which include at least a switch, an unselected or inactive segmented write line, an unselected/inactive global write line, and write line driver circuitry (not shown). Consequently, in accordance with the present invention, all unselected global write lines preferably return a fractional portion of the total write current to the write current sink. It should be appreciated that as the number of global write lines in the memory array increases, so does the number of write line current return paths, thereby significantly diminishing the write line current flowing across any one unselected segmented group of memory cells and thus reducing the adverse effects of magnetic field interaction among adjacent memory cells.

Figure 1A:
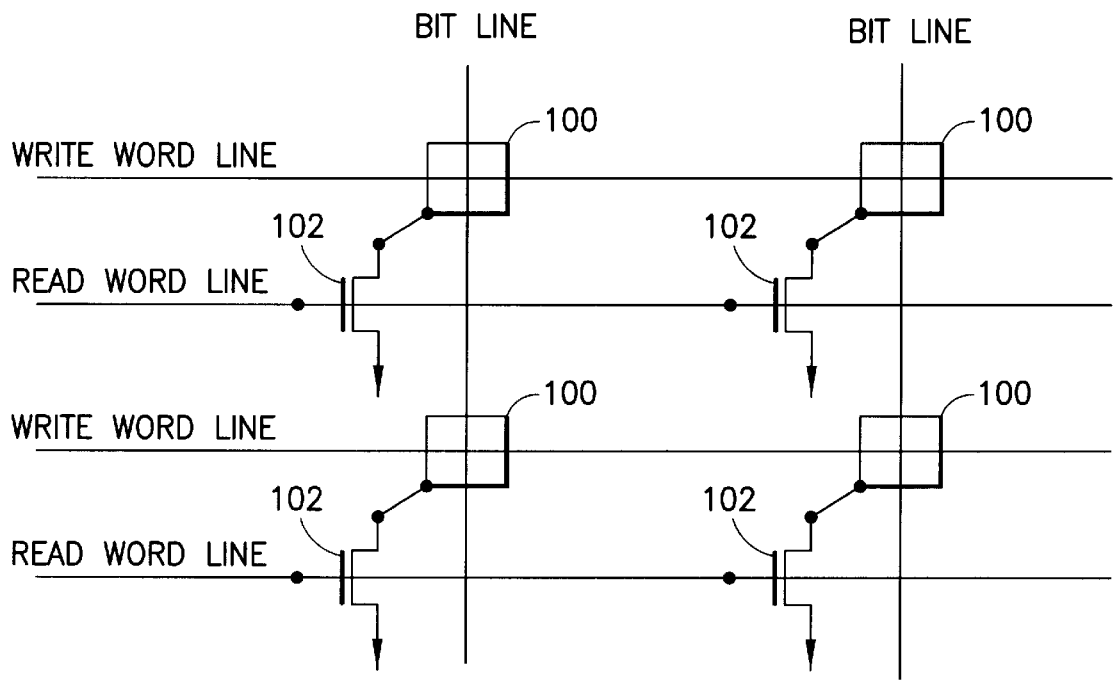
FIG. 1A is an electrical schematic diagram illustrating a conventional MTJ memory array which includes a field effect transistor (FET) with each MTJ memory element.
Figure 8:
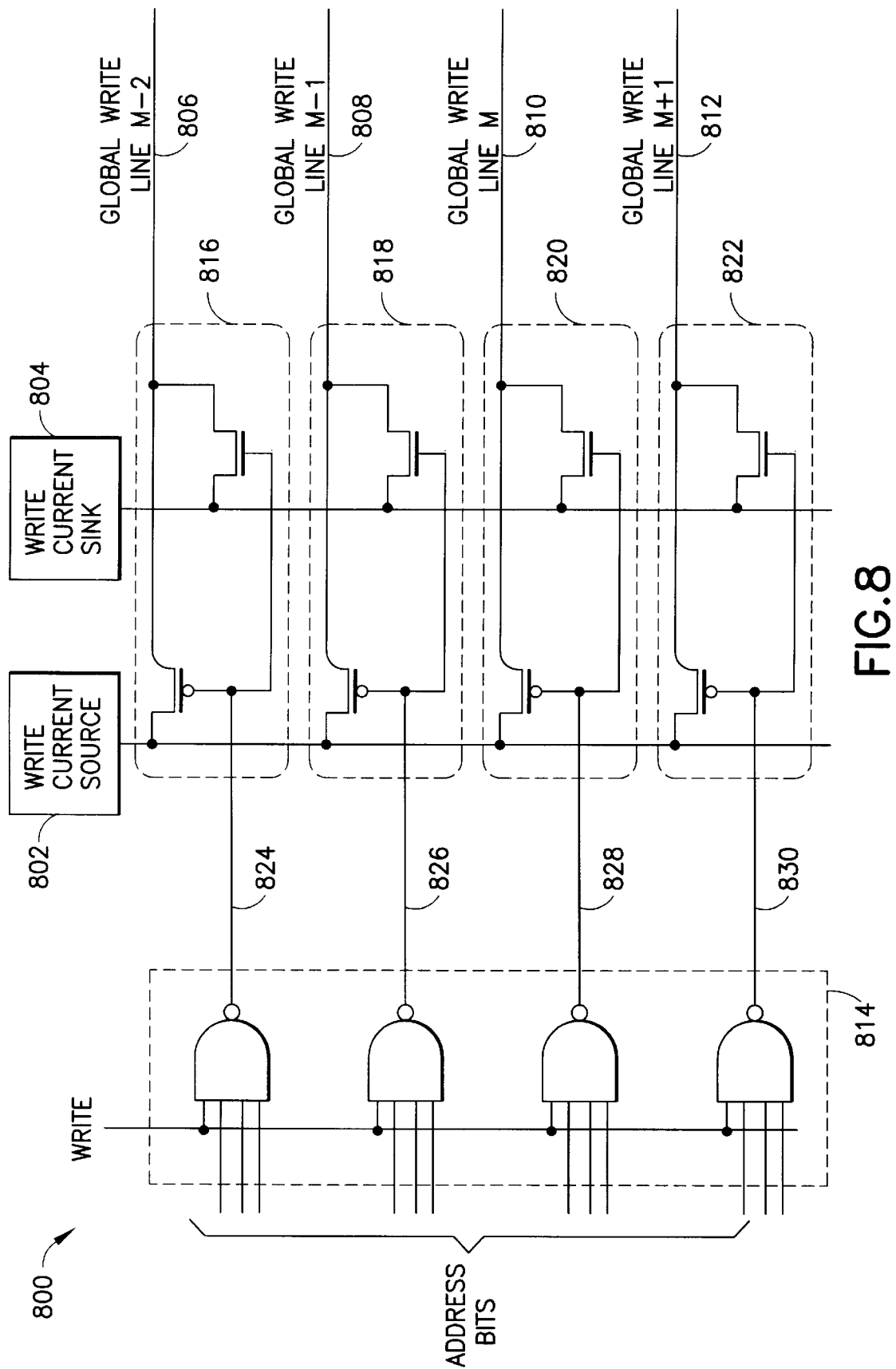
FIG. 8 is an electrical schematic diagram illustrating an exemplary decoder and unipolar driver circuit formed in accordance with the present invention for supplying and retrieving write current to and from, respectively, the segmented write line memory array of FIG. 7.

In FIG. 8, an exemplary write line driver circuit 800 suitable for use with the memory architecture of FIG. 1A and the split return current embodiment of FIG. 7 is shown. With reference now to FIG. 8, each global write line 806, 808, 810, 812 is preferably connected to a pair of complimentary PMOS and NMOS FET switches 816, 818, 820, 822, respectively, each switch pair including at least one control input 824, 826, 828, 830, respectively, for selecting whether the particular global write line connected thereto is to be connected to a common write current source 802 or write current sink 804. Although depicted as a pair of complimentary NMOS/PMOS transistors, one skilled in the art will appreciate that the present invention similarly contemplates the use of any suitable circuit device or configuration (e.g., MUX, etc.) for selectively connecting the global write lines to either the write current source 802 or sink 804.

As shown in FIG. 8, the switches 816, 818, 820, 822 are preferably operatively connected to and controlled by a write line decoder 814 which receives, as inputs, a plurality of address bits and at least one write signal for selecting the appropriate memory cells to be written. The write decoder 814 is preferably configured so that essentially all of the outputs 824, 826, 830 of the write decoder 814 are logic high and that one output 828 of the decoder 814 is logic low. Of course, the inverse logic may also be used, depending upon the active logic levels of the switches employed. In this manner, all of the global write lines except one will be connected to the write current sink 804 and the selected global write line 810 will be connected to the write current source 802. Thus the return write line current will be distributed across a network of unselected global write lines and corresponding unselected segmented write lines to substantially eliminate any adverse effects of stray magnetic field interaction among memory cells not targeted for writing.

The return write currents preferably flow through several global write lines and their respective segmented write lines, as determined by the switches coupled to the segmented write lines, which effectively function as a resistive ladder network. The resistive loading of each segmented write line, which includes the relative size of the switch(es) at the end of each segmented write line, as well as the NMOS switches connecting the unselected global write lines to the write current sink, preferably adjusts the write current values in the adjacent segmented write lines. By controlling the size of the devices comprising these switches, the current flowing through any one segmented write line, and thus the magnetic field emanating from the segmented write line, may be controlled as desired. Although the preferred write line driver circuit 800 illustrated in FIG. 8 utilizes all unselected global write lines as write line current return conductors, the present invention contemplates numerous alternative write line driver topologies that may be suitably employed which use only predetermined unselected global or segmented write lines for returning the write line current.

Additionally, segmented write lines residing in a different segmented bit slice(s) may be similarly employed in order to further distribute the return write line current, with modifications to the write line driver circuitry.

Figure 2D:
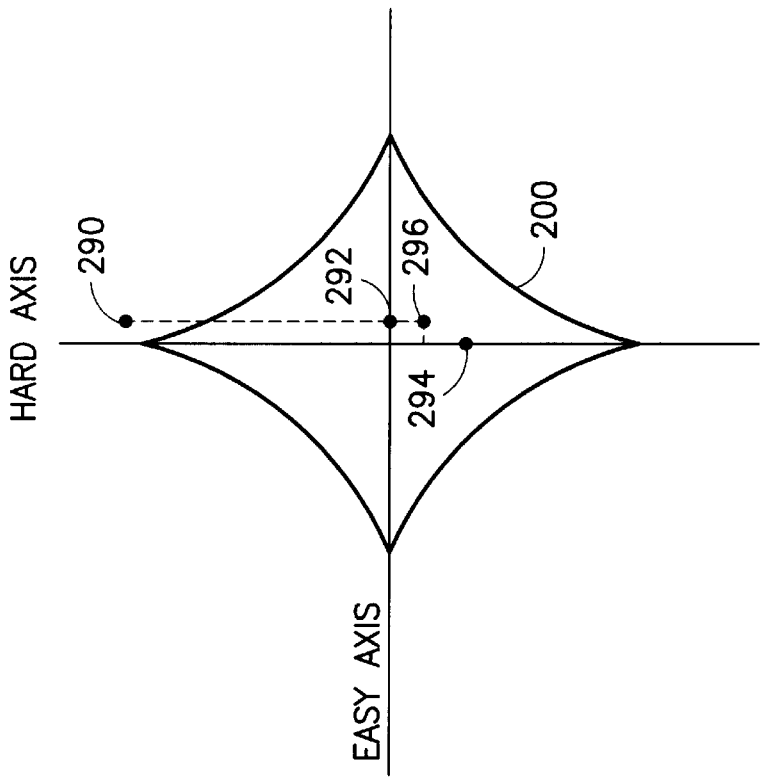
FIG. 2D is a graphical representation of magnetic field points superimposed on a switching asteroid illustrating a write operation for a segmented write line architecture formed in accordance with a third embodiment of the present invention.
Figure 2C:
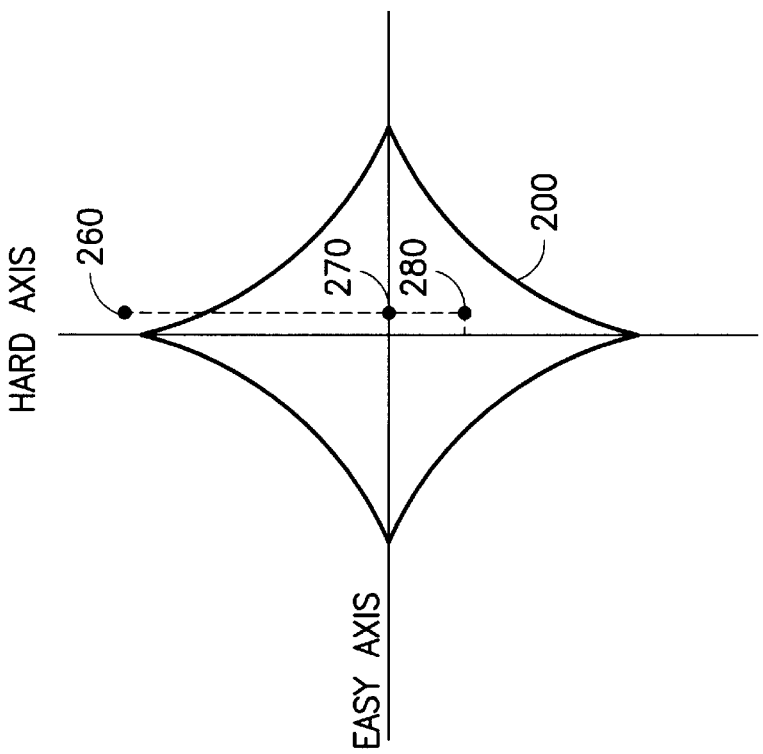
FIG. 2C is a graphical representation of magnetic field points superimposed on a switching asteroid illustrating a write operation for a segmented write line architecture formed in accordance with a second embodiment of the present invention.

As previously discussed above, magnetic memory elements are written by applying a combination of $H_h$ hard axis and $H_e$ easy axis fields outside the boundary of the asteroid curve. As a consequence of the divided return write current embodiment of the present invention, an example of which is shown in FIG. 7, the fractional return currents traverse the segmented write lines of unselected segmented groups of memory cells, within the same segmented bit slice as the selected group of cells, creating a half-select field along the hard axes of these unintended cells. FIG. 2C illustrates an example of a switching asteroid for the architecture of FIG. 7, wherein the group of memory cells sharing the active segmented write line has a magnetic field point 260 (or a mirror image about the hard axis) outside the boundary 200 of the switching asteroid. The combination of magnetic fields arising from the fractional return current and the half-select bit line current may produce a field point 280 that is in close proximity to the switching asteroid boundary 200, thus narrowing the write margin between selected and unselected cells. It is preferable, therefore, to decrease the easy axis field and increase the hard axis field of the selected cells while minimizing the hard axis field applied to the unselected cells, ideally to substantially zero as represented by field point 270.

Figure 9:
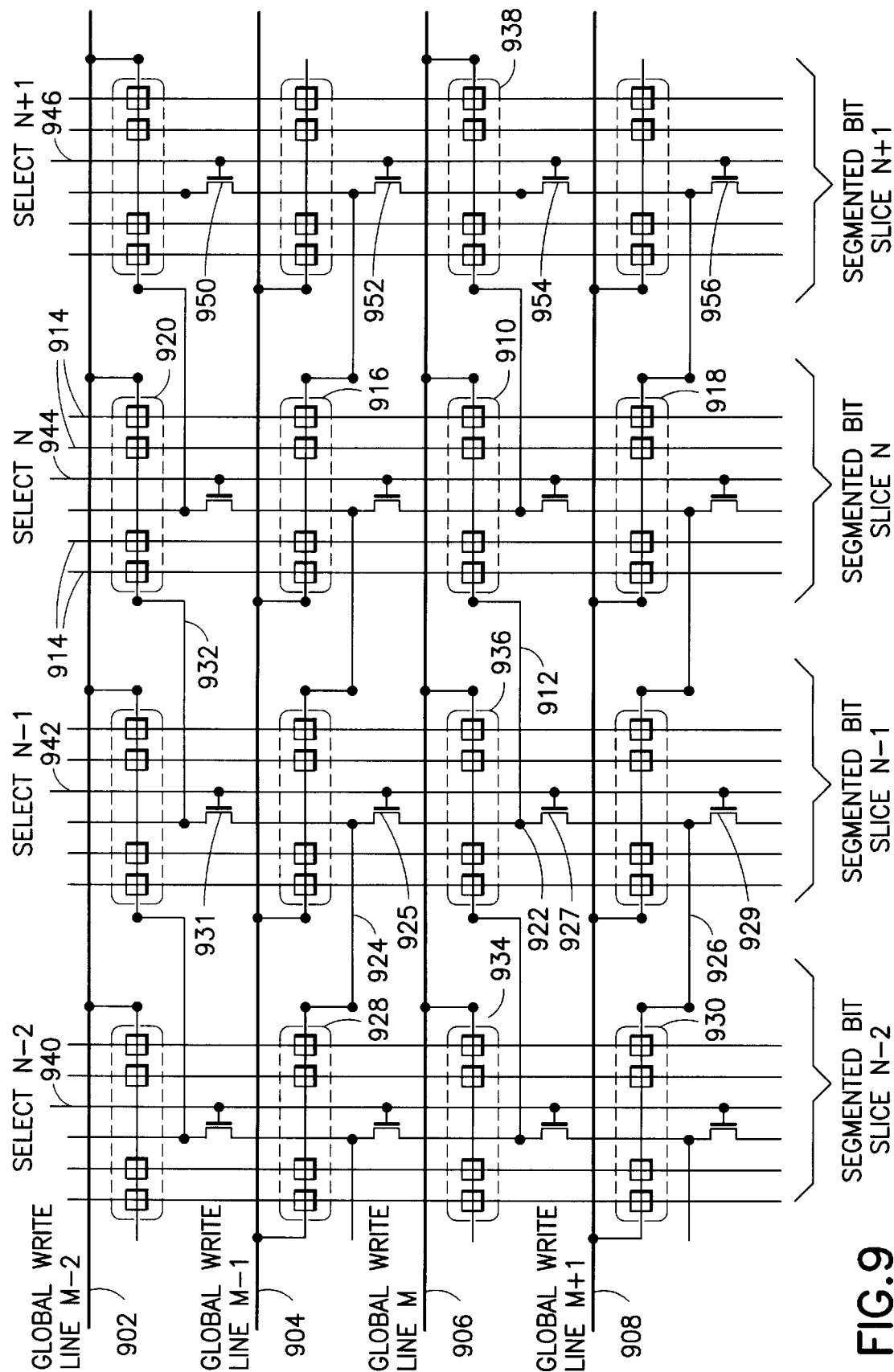
FIG. 9 is an electrical schematic diagram illustrating a preferred embodiment of the segmented write line memory architecture formed in accordance with the present invention featuring divided return current paths which traverse unselected bit slices.

In order to accomplish this, FIG. 9 illustrates an exemplary embodiment of the simple divided return current architecture previously described in connection with FIG. 7. The novel divided return current arrangement of FIG. 9 is a modification of the scheme depicted in FIG. 7, although the same fundamental concept of distributing the return write line current over a plurality of unselected global write lines and segmented write lines is employed. During a write operation, address decode logic preferably selects the active or selected global write line and segmented bit slice through which the write current is driven for the purpose of writing a segmented group of memory cells.

As discussed above, the simultaneous coincidence of two orthogonal magnetic fields, namely, a hard axis field and an easy axis field, is required to write each magnetic device within the particular segmented group selected. With reference to FIG. 9, the operation of the preferred divided return current memory architecture will be described by way of example only. A destabilizing field (write line current) is preferably applied along the hard axis of a segmented group of memory cells 910 from a global write line 906 via a segmented write line 912 connected thereto. Simultaneously, bit lines 914 within segmented bit slice N preferably carry bit line currents which produce an easy axis field driving the magnetic moment of the destabilized cells of segmented group 910 to a predetermined direction corresponding to a "1" or "0" binary state. All cells within the segmented group 910 are preferably written as a result of the combined hard and easy axis fields (represented by field point 290 in FIG. 2D which is outside the boundary of the switching asteroid 200). Memory cells in segmented groups 916, 918, 920 residing in the same segmented bit slice N will experience a data field (as a result of the bit line currents) along their easy axes and will thus become half-selected (represented by field point 292 in FIG. 2D). However, these memory cells will retain their prior magnetic state since the easy axis field alone will be significantly below the minimum write threshold of the device.

With continued reference to FIG. 9, in this embodiment, like the embodiment of FIG. 7, the destabilizing current preferably crosses the active segmented group 910 via segmented write line 912 and then divides into fractional return currents at node 922. Unique to this embodiment, however, the bulk of the destabilizing current is returned along unselected segmented write lines 924, 926 (through FET switches 925, 927, respectively) coupled to segmented groups 928, 930, respectively. Preferably, these segmented groups 928, 930 do not cross selected segmented bit slice N, hence the memory cells in segmented groups 928, 930 receive at most only half the hard axis field of the selected cells and essentially no easy axis field (represented by field point 294 in FIG. 2D). Although a small fraction of destabilizing current may trickle back through segmented write line 932 (via FET switch 931), the return write current will be significantly diminished at this point such that no significant adverse magnetic field interaction occurs (represented by field point 296 in FIG. 2D). Ideally, all segmented groups outside segmented bit slice N experience substantially zero net field along their easy axes and at most minimal net field along their hard axes.

As discussed herein, a combination of global write lines, segmented write lines and switches preferably convey a destabilizing current, in close proximity, to selected memory cells within a segmented group 910 coupled to corresponding segmented write line 912. In this fashion, a large destabilizing field can be applied to memory cells within segmented group 910, without having this same magnitude field applied to memory cells within other segmented groups 934, 936, 938 which share the same global write line 906. As in the previous embodiments of the present invention, the destabilizing current originates from a write current source (see e.g., FIG. 8), passes through a selected write line driver (not shown) and subsequently flows through a selected global write line. All other (unselected) global write lines are preferably connected to a write current sink (see e.g., FIG. 8) via a suitable write line driver circuit, as appreciated by those skilled in the art.

Figure 10:
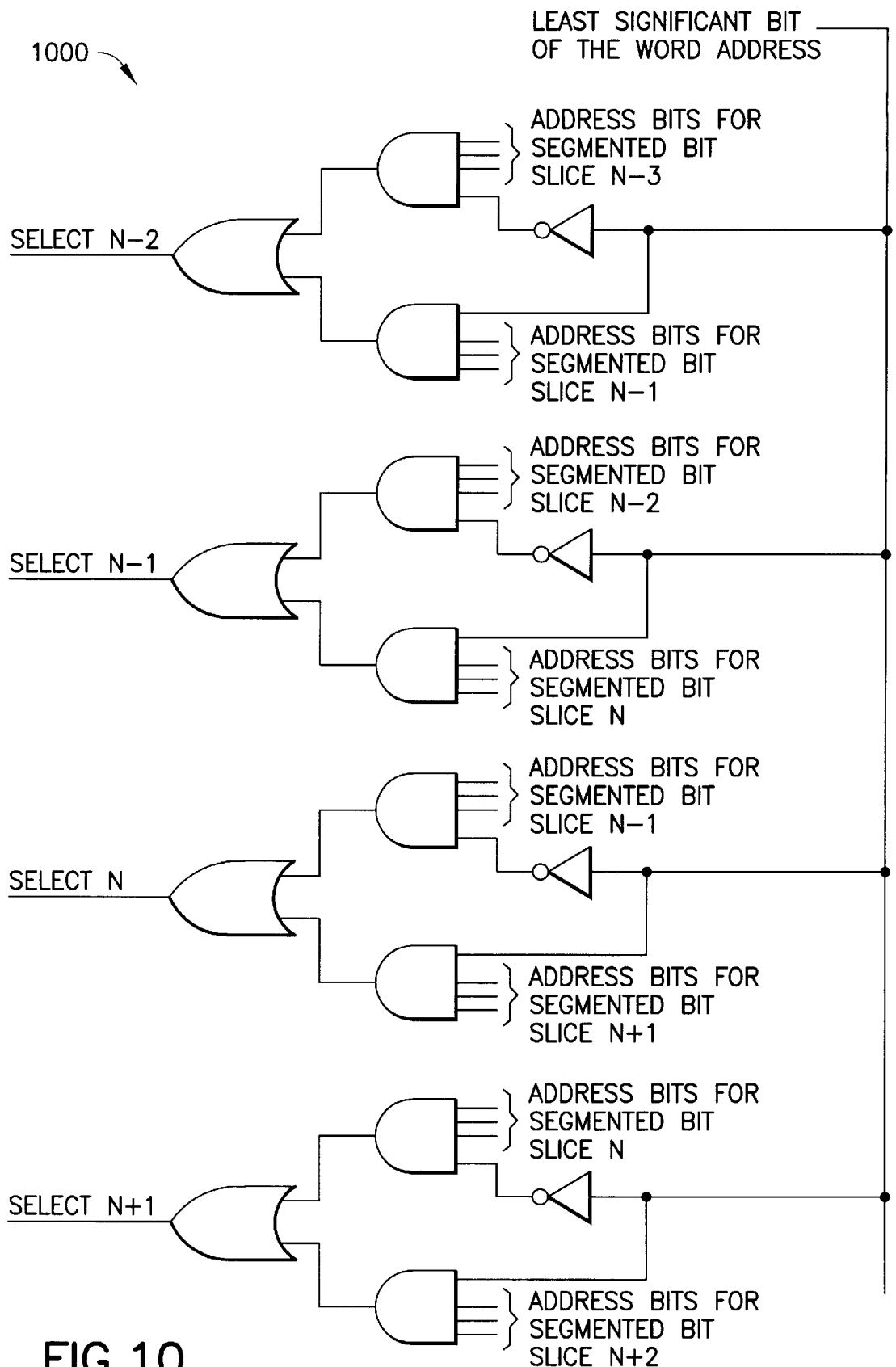
FIG. 10 is an electrical schematic diagram illustrating an exemplary decode circuit formed in accordance with the present invention for driving the select switches of the segmented bit slices depicted in FIG. 9.

The select lines 940, 942, 944, 946, for operatively determining the appropriate return write line current paths, require a unique decoding scheme. FIG. 10 illustrates an exemplary select line decoder circuit 1000 suitable for use with the segmented write line architecture shown in FIG. 9. Each of the outputs from the select line decoder 1000 are preferably connected to a chain of switches (e.g., 931, 925, 927, 929 in FIG. 9), residing in the same segmented bit slice, for determining the write line current return path(s) as desired. With reference again to FIG. 9, in the previous example describing the write operation on the cells within segmented group 910, the switches 925, 927, 929, 931 located in segmented bit slice N−1 are preferably enabled. However, for writing the memory cells in segmented group 916, for example, switches 950, 952, 954, 956 residing in segmented bit slice N+1 are preferably enabled. In general, the switch chain selected preferably alternates from a segmented bit slice located to the left of the active segmented bit slice, to a segmented bit slice located to the right of the active segmented bit slice. In order to accomplish this alternating scheme, inputs to the select line decoder 1000 (see FIG. 10) for driving the select lines 940, 942, 944, 946 preferably include predetermined segmented bit slice addresses and the least significant bit from the word address.

Figure 1B:
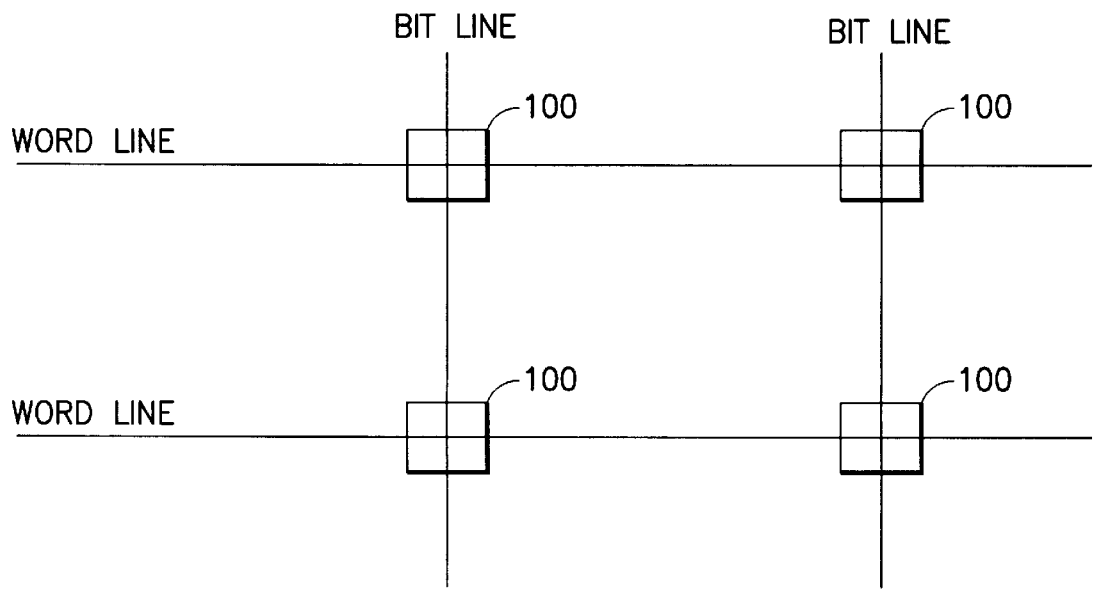
FIG. 1B is an electrical schematic diagram illustrating a conventional MTJ memory array wherein memory elements are disposed at the intersection of orthogonal word and bit lines.

Segmenting the write line in accordance with the present invention provides an opportunity to optimize the thickness of the global write lines and the segmented write lines, thereby satisfying at least two additional competing goals not attainable by conventional memory arrangements. As a first goal, a low resistance write line is desired. In large memory arrays (e.g., with 1024 cells per write line), the resistance of the write line is typically hundreds of ohms and the write currents required to write the cells are on the order of several milliamperes to tens of milliamperes. The combination of high resistance and high write current produces large voltage drops in the write line of typically one volt or more. In the case of the memory architecture depicted in FIG. 1B, the voltages that are generated are large enough to potentially damage the magnetic tunnel junction device, thereby making the circuit design extremely challenging, if not impossible. A thick conductor is therefore desired for the write line conductor in order to reduce the overall resistance of the line.

A second design objective is to generate large magnetic fields with as small a current as possible, both to minimize overall power consumption and to reduce the size of the switching circuits and other devices that are necessary to direct the write current across the desired memory cells for writing. Recall that the magnetic field strength emanating from a conductor varies inversely with the square of the distance from the conductor. Hence, the magnetic field emanating from just above or below a given write line will be larger, for the same amount of write current, by making the cross section of the write line as thin as possible, thus placing the write line in closer proximity to the memory elements. In the case of the memory architecture of FIG. 1B, this can provide a magnetic field strength that is on the order of two to three times larger, but would greatly increase the resistance of the write line.

In a preferred embodiment, the segmented write line memory architecture of the present invention satisfies both of these otherwise competing objectives by utilizing a thick conductor for the global write line(s), which is necessary in order to meet the low resistance objective, while utilizing a very thin, relatively wide conductor for the segmented write lines, which is necessary in order to meet the high magnetic field strength efficiency objective. Since the segmented write lines are local to the selected segmented group of memory cells and are relatively short in span, the added resistance of a very thin segmented write line conductor is insignificant. Moreover, since the memory cells are not placed in close proximity to any global write lines, the added thickness of the global write line conductors has essentially no adverse impact on the magnetic field strength applied to the cells. The present invention, therefore, allows the use of smaller write line currents, resulting in greater efficiency and reduced power consumption. As an added and important benefit, the present invention also facilitates a more dense memory structure since the write current can be reduced (resulting in a diminished magnetic field emanating from a segmented write line), thereby allowing adjacent memory cells to be placed in closer proximity to each other without being subjected to stray magnetic field interaction. In 0.25-micron technology, for example, it is preferable to pick a global write line thickness of about 0.25 to 0.5 microns and a segmented write line thickness of about 0.1 to 0.25 microns.

In general, segmented write lines and bit lines must be substantially orthogonal to each other in order to realize the functions of destabilizing the memory element and writing the memory element to a one or zero state. Since global write lines are physically separated/isolated from the memory elements, no such restriction need be applied to their orientation with respect to the segmented write lines and memory elements. In the present invention, each bit line is defined as carrying a bi-directional current which generates the easy axis field, and each segmented write line is defined as carrying a destabilizing current which generates the hard axis field. Furthermore, it should be noted that the relative magnitudes of easy and hard axis fields depicted on the switching asteroid of FIGS. 2A–2D are merely illustrative.

It should be appreciated that the present invention can be modified in several different ways, such as, for example, by exchanging PMOS and NMOS devices and reversing voltage polarity, as appreciated by those skilled in the art. Moreover, easy and hard axis orientation may be interchanged (or mirrored). In a similar fashion, the present invention may be implemented, for example, using a cross point MTJ cell, a cell with a MTJ device including a diode (see e.g., U.S. Pat. No. 5,640,343), a MTJ device including a switch, or other thin film magnetic memory cells such as a "hybrid ferromagnet-semiconductor nonvolatile memory," as depicted in FIG. 4 of "Magnetoelectronic Memories Last and Last . . . ", by Mark Johnson (*IEEE Spectrum*, February 2000).

In accordance with the present invention, an architecture for selectively writing one or more magnetic memory cells in a magnetic random access memory (MRAM) device is provided. The unique memory architecture, in at least one embodiment, comprises at least one write line including a global write line conductor and a plurality of segmented write line conductors connected thereto, each global write line conductor being substantially isolated from the memory cells. A plurality of segmented groups, each segmented group including a plurality of memory cells are operatively coupled to a corresponding segmented write line conductor. The segmented write line architecture further includes at least one write line current return conductor and a plurality of segmented group select switches, each group select switch being operatively connected between a corresponding segmented write line conductor and the write line current return conductor. Each group select switch includes a group select input for receiving a group select signal, the group select switch substantially completing an electrical circuit between the corresponding segmented write line conductor and the write line current return conductor in response to the group select signal. A plurality of bit lines are operatively coupled to the magnetic memory cells for selectively writing the state of the memory cells.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the present invention.

What is claimed is:

1. An architecture for selectively writing one or more magnetic memory cells in a magnetic random access memory (MRAM) device, comprising:

at least one write line including a global write line conductor and a plurality of segmented write line conductors connected thereto, the global write line conductor being substantially isolated from the memory cells;

a plurality of segmented groups, each segmented group including a plurality of memory cells operatively coupled to a corresponding segmented write line conductor;

at least one write line current return conductor;

a plurality of segmented group select switches, each group select switch being operatively connected between a corresponding segmented write line conductor and the write line current return conductor, the group select switch including a group select input for receiving a group select signal, the group select switch substantially completing an electrical circuit between the corresponding segmented write line conductor and the write line current return conductor in response to the group select signal; and a plurality of bit lines operatively coupled to the magnetic memory cells for selectively writing the state of the memory cells.

2. The system of claim 1, wherein the bit lines are substantially orthogonal to corresponding segmented write line conductors.

3. The system of claim 1, wherein the relative cross-sectional thickness of the at least one global write line conductor is at least twice the relative cross-sectional thickness of the segmented write line conductors connected thereto.

4. The system of claim 1, wherein the states of the magnetic memory cells corresponding to a segmented group are written simultaneously.

5. The system of claim 1, wherein the write line current return conductor includes an unselected global write line conductor.

6. The system of claim 1, wherein each segmented group select switch is a field effect transistor (FET) including a drain, a source and a gate terminal, the gate terminal being operatively connected to the group select signal, and the drain and source terminals being operatively connected between the write line current return conductor and the segmented write line conductor corresponding to the segmented group.

7. The system of claim 1, further comprising a write line decoder, the decoder receiving as inputs and at least partially decoding a plurality of address bits corresponding to the one or more memory cells to be written and a write signal, the decoder selectively connecting a global write line conductor to a write current source and a write line current return conductor to a write current sink.

8. The system of claim 1, further comprising a write line decoder, the decoder receiving as inputs and at least partially decoding a plurality of address bits corresponding to the one or more memory cells to be written and a write signal, the decoder selectively connecting a selected global write line conductor to a write current source and an unselected global write line conductor to a write current sink.

9. The system of claim 8, wherein the write line decoder is operatively configured to selectively connect a global write line conductor to one of a write current source and a write current sink.

10. An architecture for selectively writing one or more magnetic memory cells in a magnetic random access memory (MRAM) device, comprising:

at least one write line including a global write line conductor and a plurality of segmented write line conductors connected thereto, the global write line conductor being substantially isolated from the memory cells;

a plurality of segmented groups, each segmented group including a plurality of memory cells operatively coupled to a corresponding segmented write line conductor;

a write line current return network, the current return network including a plurality of switches operatively connected between a selected segmented write line conductor and one or more unselected segmented write line conductors, the switches being responsive to at least one select signal, each select signal corresponding to a segmented bit slice, for distributing a return write line current across one or more unselected segmented groups in a predetermined manner; and a plurality of bit lines operatively coupled to the magnetic memory cells for selectively writing the state of the memory cells.

11. The system of claim 10, wherein switches corresponding to one or more segmented groups in a same segmented bit slice are connected in a chained configuration, each segmented write line conductor coupled to a corresponding segmented group being operatively connected to a corresponding junction between two switches in the same segmented bit slice.

12. The system of claim 11, wherein each switch is a field effect transistor (FET) including a drain, a source and a gate terminal, the gate terminal being operatively connected to the at least one select signal, and the drain and source terminals being operatively connected between at least one of:

two segmented write line conductors; and a segmented write line conductor and a switch corresponding to an adjacent segmented group in the same segmented bit slice.

13. The system of claim 10, further comprising a write line decoder, the decoder receiving as inputs and at least partially decoding a plurality of address bits corresponding to the one or more memory cells to be written and a write signal, the decoder selectively connecting a selected global write line conductor to a write current source and at least one unselected global write line conductor to a write current sink.

14. The system of claim 13, wherein the decoder is operatively configured to selectively connect all unselected global write line conductors to the write current sink, in response to the at least partial decoding of the address bits and write signal.

15. The system of claim 13, wherein the decoder is operatively configured to selectively connect each global write line conductor to one of a write current source and a write current sink.

16. The system of claim 10, wherein at least a portion of the return write line current traverses one or more segmented write line conductors corresponding to one or more unselected segmented bit slices.

17. The system of claim 10, wherein the write line current return network is operatively connected such that the return write line current does not traverse a segmented group that is adjacent to a selected segmented group.

18. The system of claim 10, wherein switches in a segmented bit slice are connected in a chained configuration, each segmented write line conductor in an adjacent segmented bit slice being connected to a corresponding junction between two switches in the selected segmented bit slice.

19. The system of claim 10, further comprising a write line decoder, the write line decoder receiving as inputs and at least partially decoding a plurality of address bits corresponding to the one or more memory cells to be written and a write signal, the decoder selectively connecting a selected global write line conductor to a write current source and at least one unselected global write line conductor to a write current sink.

20. The system of claim 10, further comprising a select line decoder, the select line decoder receiving as inputs and at least partially decoding a plurality of address bits for selecting a segmented bit slice and a least significant bit of a word address corresponding to the memory cells to be written and generating the at least one select signal, the select line decoder operatively selecting switches whereby adjacent segmented groups in the same segmented bit slice return the write line current via switches selected in alternating adjacent segmented bit slices.

* * * * *